(12) United States Patent
Cheng

(10) Patent No.: US 10,634,927 B2
(45) Date of Patent: Apr. 28, 2020

(54) MICRO LIGHT EMITTING DIODE DISPLAY PANEL

(71) Applicant: Wuhan China Star Optoelectronics Technology Co., Ltd., Wuhan, Hubei (CN)

(72) Inventor: Yan Cheng, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 140 days.

(21) Appl. No.: 16/009,672

(22) Filed: Jun. 15, 2018

(65) Prior Publication Data

US 2019/0250423 A1    Aug. 15, 2019

Related U.S. Application Data

(63) Continuation of application No. PCT/CN2018/079005, filed on Mar. 14, 2018.

(30) Foreign Application Priority Data

Feb. 9, 2018  (CN) .......................... 2018 1 0135165

(51) Int. Cl.
```
G02B 5/02      (2006.01)
H01L 25/16     (2006.01)
G09G 3/32      (2016.01)
G02B 5/18      (2006.01)
G02B 27/42     (2006.01)
```
(Continued)

(52) U.S. Cl.
CPC ......... *G02B 27/425* (2013.01); *G02B 5/0278* (2013.01); *G02B 5/1814* (2013.01); *G09G 3/32* (2013.01); *H01L 25/167* (2013.01); *G09G 2320/0626* (2013.01); *G09G 2330/021* (2013.01); *G09G 2380/02* (2013.01); *H05K 1/144* (2013.01); *H05K 1/147* (2013.01); *H05K 1/189* (2013.01); *H05K 2201/041* (2013.01); *H05K 2201/10106* (2013.01); *H05K 2201/10128* (2013.01); *H05K 2201/10166* (2013.01)

(58) Field of Classification Search
CPC .......... G09G 3/32–3258; G02B 27/425; G02B 5/0278; G02B 5/1814; H01L 25/167
See application file for complete search history.

(56) References Cited

FOREIGN PATENT DOCUMENTS

| CN | 104865750 A | 8/2015 |
|----|-------------|--------|
| CN | 105842925 A | 8/2016 |
| CN | 105976725 A | 9/2016 |

*Primary Examiner* — Michael Pervan
(74) *Attorney, Agent, or Firm* — Leong C. Lei

(57) ABSTRACT

Provided is a micro light emitting diode display panel, comprising a flexible substrate, light emitting diodes aligned in an array, a diffraction grating and a light scattering film arranged on the light emitting diodes and light valves arranged above the light scattering film; wherein the flexible substrate comprises a driving circuit, the light emitting diodes are fixed on the flexible substrate; the driving circuit is connected to the light emitting diodes to respectively drive the light emitting diodes to emit white light; the diffraction grating splits the white light emitted by the light emitting diodes to form exiting lights with various wavelengths; the light scattering film gathers an exiting light of a same wavelength in the exiting lights and disperses the exiting lights of different wavelengths to form a primary color light of at least one color; the light valves adjusts an intensity of the primary color light.

18 Claims, 3 Drawing Sheets

(51) Int. Cl.
*H05K 1/18* (2006.01)
*H05K 1/14* (2006.01)

MICRO LIGHT EMITTING DIODE DISPLAY PANEL

CROSS-REFERENCE TO RELATED APPLICATION

This application is a continuing application of PCT Patent Application No. PCT/CN2018/079005 entitled "Micro light emitting diode display panel", filed on Mar. 14, 2018, which claims priority to Chinese Patent Application No. 201810135165.8, filed on Feb. 9, 2018, both of which are hereby incorporated in its entireties by reference.

FIELD OF THE INVENTION

The present invention relates to a display field, and more particularly to a micro light emitting diode display panel.

BACKGROUND OF THE INVENTION

At present, being light, thin and convenient, energy-saving, exquisite pictures, reduced costs, and diversified functions are always the development goals of display devices. Meanwhile, as dedicating to provide various types of electronic devices, research and development have been conducted to provide various forms of display devices included in the electronic devices. The existing liquid crystal display device of the prior art includes a backlight module, a lower polarizer, an array substrate, a liquid crystal layer, a color filter substrate and an upper polarizer. These stacked structures limit the thickness and shape of liquid crystal display devices of the prior art, resulting in that the liquid crystal display devices of the prior art are hardly thinner and more flexible. In addition, the color filter substrate consumes at least 60% of the light energy. Thus, it only can rely on increasing the backlight brightness of the liquid crystal display device to satisfy the brightness requirement of the actual device, which undoubtedly increases the power consumption of the liquid crystal display device.

SUMMARY OF THE INVENTION

For solving the aforesaid issues, the present invention provides a micro light emitting diode display panel, which can be made thinner and more flexible, and does not increase the power consumption of the display panel.

A micro light emitting diode display panel provided by the present invention comprises a flexible substrate, a plurality of light emitting diodes aligned in an array, a diffraction grating and a light scattering film arranged on the plurality of light emitting diodes and a plurality of light valves arranged above the light scattering film;

wherein the flexible substrate comprises a driving circuit, the plurality of light emitting diodes are fixed on the flexible substrate; the driving circuit is connected to the plurality of light emitting diodes to respectively drive the plurality of light emitting diodes to emit white light;

the diffraction grating splits the white light emitted by the light emitting diodes to form a plurality of exiting lights with various wavelengths;

the light scattering film gathers an exiting light of a same wavelength in the exiting lights and disperses the exiting lights of different wavelengths to form a primary color light of at least one color;

the plurality of light valves respectively adjusts an intensity of the primary color light.

Preferably, the flexible substrate further comprises a flexible printed circuit connecting board and a printed circuit board substrate, the driving circuit is fixed on the printed circuit board substrate, the printed circuit board substrate is fixed on the flexible printed circuit connecting board, the plurality of light emitting diodes is fixed on the driving circuit by flip chip.

Preferably, the plurality of light emitting diodes is fixed on the driving circuit through a plurality of hemispherical structures, and the hemispherical structures are made of metal alloy.

Preferably, the plurality of light emitting diodes corresponds to a plurality of driving units aligned in an array, each of the driving units comprises at least one driving line, each driving line comprises at least one light emitting diode coupled in series, and each of the driving units comprises an electrical signal input end and an electrical signal output end.

Preferably, each row of driving units in the plurality of driving units aligned in the array is connected to a same metal wire, and each column of driving units in the plurality of driving units aligned in the array is connected to a same metal wire.

Preferably, one of the driving units and the diffraction grating and the light scattering film above the one of the driving units constitute one pixel unit of the display panel.

Preferably, one of the pixel units comprises a sub pixel of at least one color, each sub pixel comprises an area of the diffraction grating and the light scattering film emitting one primary color light of one color.

Preferably, the micro light emitting diode display further comprises a plurality of support columns aligned in an array, each of the light valves is fixed on two adjacent support columns, and an opening of the each of the light valves is directly opposite to an area between the two adjacent support columns.

Preferably, the micro light emitting diode display panel further comprises a flexible protective layer located on the plurality of light valves.

Preferably, the micro light emitting diode display panel further comprises a connector connected to the driving circuit, wherein the driving circuit communicates with a display mainboard via the connector to receive a data signal from the display mainboard, to convert the data signal into a signal voltage meeting an operating requirements of the light emitting diode and to transmit the signal voltage to the light emitting diode to control the light emitting diode to emit the white light.

The present invention further provides a micro light emitting diode display panel, comprising a flexible substrate, a plurality of light emitting diodes aligned in an array, a diffraction grating and a light scattering film arranged on the plurality of light emitting diodes, a plurality of light valves arranged above the light scattering film and a plurality of support columns aligned in an array;

wherein the flexible substrate comprises a driving circuit, the plurality of light emitting diodes are fixed on the flexible substrate; the driving circuit is connected to the plurality of light emitting diodes to respectively drive the plurality of light emitting diodes to emit white light;

the diffraction grating splits the white light emitted by the light emitting diodes to form a plurality of exiting lights with various wavelengths;

the light scattering film gathers an exiting light of a same wavelength in the exiting lights and disperses the exiting lights of different wavelengths to form a primary color light of at least one color;

the plurality of light valves respectively adjusts an intensity of the primary color light;

each of the light valves is fixed on two adjacent support columns, and an opening of the each of the light valves is directly opposite to an area between the two adjacent support columns. Preferably, the flexible substrate further comprises a flexible printed circuit connecting board and a printed circuit board substrate, the driving circuit is fixed on the printed circuit board substrate, the printed circuit board substrate is fixed on the flexible printed circuit connecting board, the plurality of light emitting diodes is fixed on the driving circuit by flip chip.

Preferably, the plurality of light emitting diodes is fixed on the driving circuit through a plurality of hemispherical structures, and the hemispherical structures are made of metal alloy.

Preferably, the plurality of light emitting diodes corresponds to a plurality of driving units aligned in an array, each of the driving units comprises at least one driving line, each driving line comprises at least one light emitting diode coupled in series, and each of the driving units comprises an electrical signal input end and an electrical signal output end.

Preferably, each row of driving units in the plurality of driving units aligned in the array is connected to a same metal wire, and each column of driving units in the plurality of driving units aligned in the array is connected to a same metal wire.

Preferably, one of the driving units and the diffraction grating and the light scattering film above the one of the driving units constitute one pixel unit of the display panel.

Preferably, one of the pixel units comprises a sub pixel of at least one color, each sub pixel comprises an area of the diffraction grating and the light scattering film emitting one primary color light of one color.

Preferably, the micro light emitting diode display panel further comprises a connector connected to the driving circuit, wherein the driving circuit communicates with a display mainboard via the connector to receive a data signal from the display mainboard, to convert the data signal into a signal voltage meeting an operating requirements of the light emitting diode and to transmit the signal voltage to the light emitting diode to control the light emitting diode to emit the white light.

The implementation of the present invention possesses the benefits: the plurality of light emitting diodes is fixed on the flexible substrate in the present invention. The light emitting diodes are controlled to emit white light by the drive circuit of the flexible substrate. The white light emitted by the light emitting diodes passes through the diffraction grating and the light scattering film to form the primary color light of at least one color. The light valves control the light intensity of each primary color light to result in brightness differences and color differences to achieve flexible display. In comparison with the liquid crystal display device of the prior art, the display panel of the present invention only comprises the flexible substrate, the light emitting diodes, the diffraction grating, the light scattering film and the light valves without a stacked structure of a backlight module, a lower polarizer, an array substrate, a liquid crystal layer, a color filter and an upper polarizer. Thus, it can be made thinner and more flexible, and does not need the color filter, which consumes a lot of light energy. The backlight is also not required for satisfying the brightness requirement of the display panel, thus will not increase the power consumption of the display panel.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Figure 1:
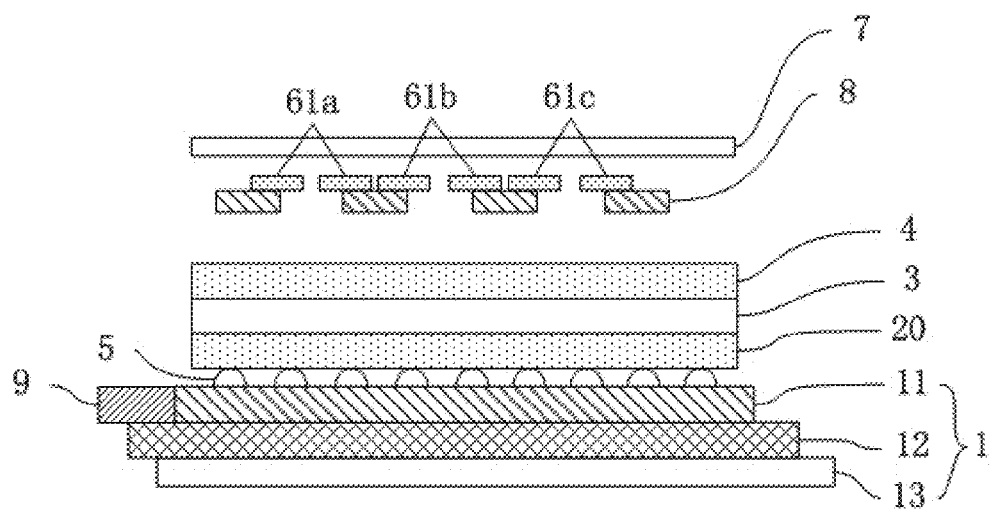
FIG. 1 is a structural diagram of a micro light emitting diode display panel provided by the present invention.
Figure 2:
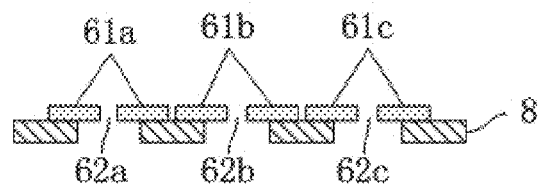
FIG. 2 is a diagram of light valves provided by the present invention.

The present invention provides a micro light emitting diode display panel as shown in FIG. 2. The display panel comprises a flexible substrate 1, a plurality of light emitting diodes 2 aligned in an array, a diffraction grating 3 and a light scattering film 4 arranged on the plurality of light emitting diodes 2 and a plurality of light valves arranged above the light scattering film 4. The labels 61a, 61b and 61c shown in FIG. 1 are light valves. As shown in FIG. 2, the corresponding openings of the light valves 61a, 61b and 61c are 62a, 62b and 62c, respectively.

The flexible substrate 1 comprises a driving circuit 11, the plurality of light emitting diodes 2 are fixed on the flexible substrate 1 by flip chip; the driving circuit 11 is connected to the plurality of light emitting diodes 2 to respectively drive the plurality of light emitting diodes 2 to emit white light.

The diffraction grating 3 splits the white light emitted by the light emitting diodes 2 to form a plurality of exiting lights with various wavelengths.

The light scattering film 4 gathers an exiting light of a same wavelength in the exiting lights and disperses the exiting lights of different wavelengths to form a primary color light of at least one color, such as primary color lights of red, green and blue colors.

The plurality of light valves respectively adjusts an intensity of the primary color light.

Moreover, the flexible substrate 1 further comprises a flexible printed circuit (FPC) connecting board 13 and a printed circuit board (PCB) substrate 12, the driving circuit 11 is fixed on the printed circuit board substrate 12, the printed circuit board substrate 12 is fixed on the flexible printed circuit connecting board 13, the plurality of light emitting diodes 2 is fixed on the driving circuit 11 by flip chip. The FPC connecting board 13 is used to connect the PCB substrate 12 with an external display mainboard. The PCB substrate 12 may be used to provide the light emitting diodes 2 with a power supply voltage. In another embodiment, the PCB substrate 12 may be a metal plate with a thickness of 0.2 mm.

Furthermore, the plurality of light emitting diodes 2 is fixed on the driving circuit 11 through a plurality of hemispherical structures 5, and the hemispherical structures 5 are made of metal alloy.

Figure 3:
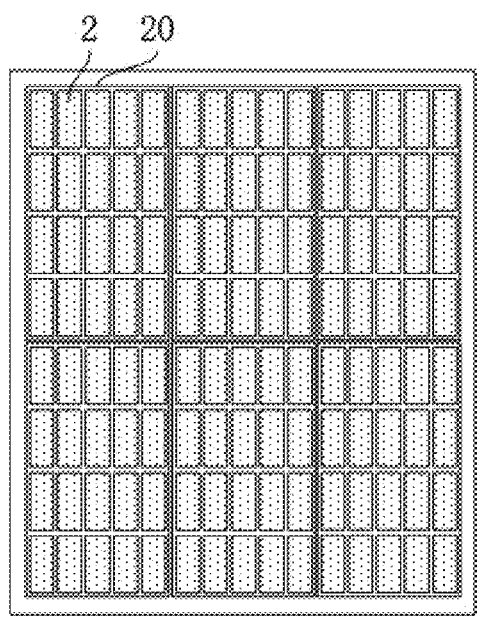
FIG. 3 is a diagram of driving units on a micro light emitting diode display panel provided by the present invention.

Furthermore, as shown in FIG. 3, the plurality of light emitting diodes 2 corresponds to a plurality of driving units 20 aligned in an array, each of the driving units 20 comprises at least one driving line, each driving line comprises at least one light emitting diode 2 coupled in series, and each of the driving units 20 comprises an electrical signal input end and an electrical signal output end. The maximum current flowing into each of the driving units 20 is determined by the number of light emitting diodes 2 in the driving unit 20.

Figure 4:
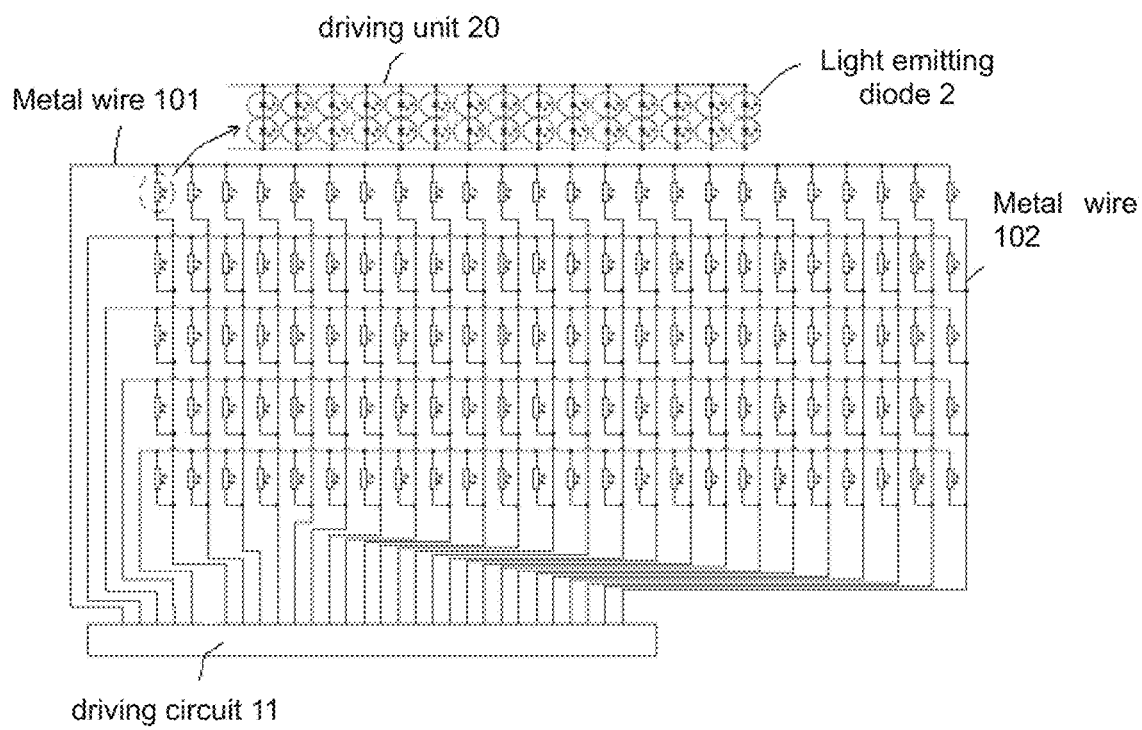
FIG. 4 is a circuit diagram of a micro light emitting diode display panel provided by the present invention.
Figure 5:
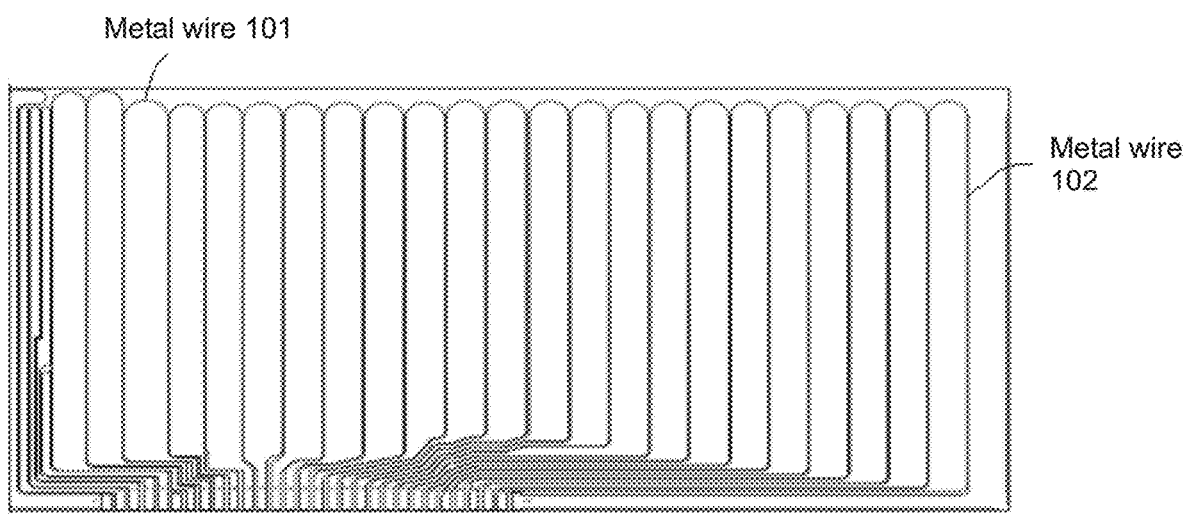
FIG. 5 is a diagram of back traces of the driving units provided by the present invention.

Moreover, as shown in FIG. 4, each row of driving units 20 in the plurality of driving units 20 aligned in the array is connected to a same metal wire, and each column of driving units 20 in the plurality of driving units 20 aligned in the array is connected to a same metal wire. For instance, the uppermost row of driving units 20 is connected to the metal wire 101, and the rightmost column of the driving units 20 is connected to the metal wire 102. The back traces of the driving units 20 is shown in FIG. 5. The shape of the metal wire 101 may be a wavy line.

Figure 6:
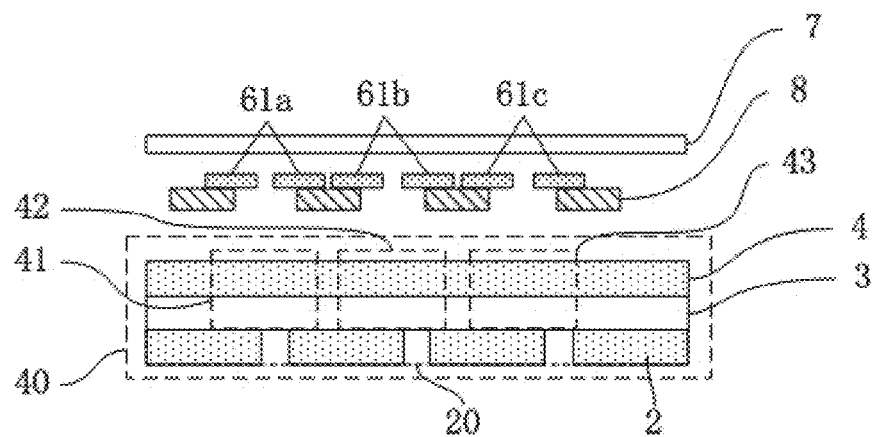
FIG. 6 is a diagram of a pixel unit of a micro light emitting diode display panel provided by the present invention.

Moreover, as shown in FIG. 6, one of the driving units 20 and the diffraction grating 3 and the light scattering film 4 above the one of the driving units 20 constitute one pixel unit 40 of the display panel. As the display panel displays, one pixel unit 40 provides a color value and one driving unit 20 may comprise a plurality of light emitting diodes 2. As one of the light emitting diodes 2 in one of the driving units 20 fails, other light emitting diodes 2 still can emit light so that each pixel unit 40 can show colors normally. In the aforesaid display panel, the number of light emitting diodes 2 may be designed according to the pixel size of the display panel. The white light emitted by the light emitting diodes 2 passes through the diffraction grating 3 and the light scattering film 4 to form the primary color light of at least one color. The primary color light exits to the opening area of each pixel unit, i.e. the light exits to the opening of the light valve above each pixel unit.

Moreover, one of the pixel units 40 comprises a sub pixel of at least one color, each sub pixel comprises an area of the diffraction grating 3 and the light scattering film 4 emitting one primary color light of one color. As shown in FIG. 6, the red sub pixel is labeled by the reference numeral 41, the green sub pixel is labeled by the reference number 42, and the blue sub pixel is labeled by the reference number 43. A light valve is correspondingly arranged above each sub pixel. As the light valve is closed, the sub pixel illumination cannot be observed from the display panel, and the sub pixel is in an off state. As the light valve is opened, i.e. the sub pixel is in an on state, and in the display process of the display panel, the light valve is in a high speed switching state. According to the switching frequency of the light valve, the display panel can show images of various grayscales.

For instance, each pixel unit comprises the light valves 61a, 61b and 61c above shown in FIG. 1 or FIG. 2. The light valve 61a is a light valve above the red sub pixel, the light valve 61b is a light valve above the green sub pixel, and the light valve 61c is a light valve above the blue sub pixel.

Moreover, the micro light emitting diode display further comprises a plurality of support columns 8 aligned in an array, each of the light valves is fixed on two adjacent support columns 8, and an opening of the each of the light valves is directly opposite to an area between the two adjacent support columns 8.

Moreover, the micro light emitting diode display further comprises a flexible protective layer 7 located on the plurality of light valves.

Figure 7:
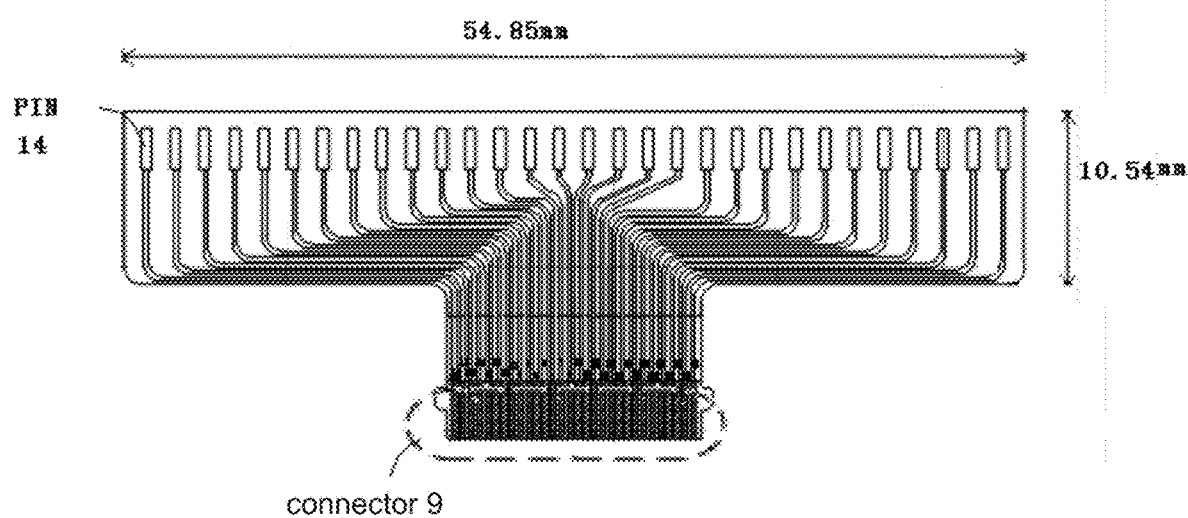
FIG. 7 is a diagram of connector traces provided by the present invention.

Moreover, the micro light emitting diode display further comprises a connector 9 connected to the driving circuit 11. The driving circuit 11 communicates with a display mainboard via the connector 9. The driving circuit 11 receives a data signal from the display mainboard and converts the data signal into a signal voltage meeting operating requirements of the light emitting diode 2 and to transmit the signal voltage to the light emitting diode 2 to control the light emitting diode 2 to emit the white light. In another embodiment, as shown in FIG. 7, the connector 9 is electrically connected with the pin 14, and is connected to the external display mainboard via the pin 14. The width of the pin 14 is 54.85 mm.

In conclusion, the plurality of light emitting diodes 2 is fixed on the flexible substrate 1 in the present invention. The light emitting diodes 2 are controlled to emit white light by the drive circuit 11 of the flexible substrate 1. The white light emitted by the light emitting diodes 2 passes through the diffraction grating 3 and the light scattering film 4 to form the primary color light of at least one color. The light valves control the light intensity of each primary color light to result in brightness differences and color differences to achieve flexible display. In comparison with the liquid crystal display device of the prior art, the display panel of the present invention only comprises the flexible substrate 1, the light emitting diodes 2, the diffraction grating 3, the light scattering film 4 and the light valves without a stacked structure of a backlight module, a lower polarizer, an array substrate, a liquid crystal layer, a color filter and an upper polarizer. Thus, it can be made thinner and more flexible, and does not need the color filter, which consumes a lot of light energy. The backlight is also not required for satisfying the brightness requirement of the display panel, thus will not increase the power consumption of the display panel.

The above content with the specific preferred embodiments of the present invention is further made to the detailed description, the specific embodiments of the present invention should not be considered limited to these descriptions. It should be noted that any persons who are skilled in the art change or replacement which is easily derived should be covered by the protected scope of the invention. Thus, the protected scope of the invention should go by the subject claims.

What is claimed is:

1. A micro light emitting diode display panel, comprising a flexible substrate, a plurality of light emitting diodes aligned in an array, a diffraction grating and a light scattering film arranged on the plurality of light emitting diodes and a plurality of light valves arranged above the light scattering film;

wherein the flexible substrate comprises a driving circuit, the plurality of light emitting diodes are fixed on the flexible substrate; the driving circuit is connected to the plurality of light emitting diodes to respectively drive the plurality of light emitting diodes to emit white light;

the diffraction grating splits the white light emitted by the light emitting diodes to form a plurality of exiting lights with various wavelengths;

the light scattering film gathers an exiting light of a same wavelength in the exiting lights and disperses the exiting lights of different wavelengths to form a primary color light of at least one color;

the plurality of light valves respectively adjusts an intensity of the primary color light.

2. The micro light emitting diode display panel according to claim 1, wherein the flexible substrate further comprises a flexible printed circuit connecting board and a printed circuit board substrate, the driving circuit is fixed on the printed circuit board substrate, the printed circuit board substrate is fixed on the flexible printed circuit connecting board, the plurality of light emitting diodes is fixed on the driving circuit by flip chip.

3. The micro light emitting diode display panel according to claim 2, wherein the plurality of light emitting diodes is fixed on the driving circuit through a plurality of hemispherical structures, and the hemispherical structures are made of metal alloy.

4. The micro light emitting diode display panel according to claim 1, wherein the plurality of light emitting diodes corresponds to a plurality of driving units aligned in an array, each of the driving units comprises at least one driving line, each driving line comprises at least one light emitting diode coupled in series, and each of the driving units comprises an electrical signal input end and an electrical signal output end.

5. The micro light emitting diode display panel according to claim 4, wherein each row of driving units in the plurality of driving units aligned in the array is connected to a same metal wire, and each column of driving units in the plurality of driving units aligned in the array is connected to a same metal wire.

6. The micro light emitting diode display panel according to claim 4, wherein one of the driving units and the diffraction grating and the light scattering film above the one of the driving units constitute one pixel unit of the display panel.

7. The micro light emitting diode display panel according to claim 6, wherein one of the pixel units comprises a sub pixel of at least one color, each sub pixel comprises an area of the diffraction grating and the light scattering film emitting one primary color light of one color.

8. The micro light emitting diode display panel according to claim 1, further comprising a plurality of support columns aligned in an array, each of the light valves is fixed on two adjacent support columns, and an opening of the each of the light valves is directly opposite to an area between the two adjacent support columns.

9. The micro light emitting diode display panel according to claim 1, further comprising a flexible protective layer located on the plurality of light valves.

10. The micro light emitting diode display panel according to claim 1, further comprising a connector connected to the driving circuit, wherein the driving circuit communicates with a display mainboard via the connector to receive a data signal from the display mainboard, to convert the data signal into a signal voltage meeting an operating requirements of the light emitting diode and to transmit the signal voltage to the light emitting diode to control the light emitting diode to emit the white light.

11. A micro light emitting diode display panel, comprising a flexible substrate, a plurality of light emitting diodes aligned in an array, a diffraction grating and a light scattering film arranged on the plurality of light emitting diodes, a plurality of light valves arranged above the light scattering film and a plurality of support columns aligned in an array;
wherein the flexible substrate comprises a driving circuit, the plurality of light emitting diodes are fixed on the flexible substrate; the driving circuit is connected to the plurality of light emitting diodes to respectively drive the plurality of light emitting diodes to emit white light;
the diffraction grating splits the white light emitted by the light emitting diodes to form a plurality of exiting lights with various wavelengths;
the light scattering film gathers an exiting light of a same wavelength in the exiting lights and disperses the exiting lights of different wavelengths to form a primary color light of at least one color;
the plurality of light valves respectively adjusts an intensity of the primary color light;
each of the light valves is fixed on two adjacent support columns, and an opening of the each of the light valves is directly opposite to an area between the two adjacent support columns.

12. The micro light emitting diode display panel according to claim 11, wherein the flexible substrate further comprises a flexible printed circuit connecting board and a printed circuit board substrate, the driving circuit is fixed on the printed circuit board substrate, the printed circuit board substrate is fixed on the flexible printed circuit connecting board, the plurality of light emitting diodes is fixed on the driving circuit by flip chip.

13. The micro light emitting diode display panel according to claim 12, wherein the plurality of light emitting diodes is fixed on the driving circuit through a plurality of hemispherical structures, and the hemispherical structures are made of metal alloy.

14. The micro light emitting diode display panel according to claim 11, wherein the plurality of light emitting diodes corresponds to a plurality of driving units aligned in an array, each of the driving units comprises at least one driving line, each driving line comprises at least one light emitting diode coupled in series, and each of the driving units comprises an electrical signal input end and an electrical signal output end.

15. The micro light emitting diode display panel according to claim 14, wherein each row of driving units in the plurality of driving units aligned in the array is connected to a same metal wire, and each column of driving units in the plurality of driving units aligned in the array is connected to a same metal wire.

16. The micro light emitting diode display panel according to claim 14, wherein one of the driving units and the diffraction grating and the light scattering film above the one of the driving units constitute one pixel unit of the display panel.

17. The micro light emitting diode display panel according to claim 16, wherein one of the pixel units comprises a sub pixel of at least one color, each sub pixel comprises an area of the diffraction grating and the light scattering film emitting one primary color light of one color.

18. The micro light emitting diode display panel according to claim 11, further comprising a connector connected to the driving circuit, wherein the driving circuit communicates with a display mainboard via the connector to receive a data signal from the display mainboard, to convert the data signal into a signal voltage meeting an operating requirements of the light emitting diode and to transmit the signal voltage to the light emitting diode to control the light emitting diode to emit the white light.

* * * * *